United States Patent
Su et al.

(10) Patent No.: US 11,509,078 B2
(45) Date of Patent: Nov. 22, 2022

(54) COMPLIANT PIN STRUCTURE FOR DISCRETE ELECTRICAL COMPONENTS

(71) Applicant: VITESCO TECHNOLOGIES USA, LLC, Auburn Hills, MI (US)

(72) Inventors: Patrick Su, Shelby Township, MI (US); Kevin D Moore, Bloomfield Hills, MI (US)

(73) Assignee: VITESCO TECHNOLOGIES USA, LLC., Auburn Hills, MI (US)

( * ) Notice: Subject to any disclaimer, the term of this patent is extended or adjusted under 35 U.S.C. 154(b) by 717 days.

(21) Appl. No.: 16/046,591

(22) Filed: Jul. 26, 2018

(65) Prior Publication Data

US 2020/0036118 A1  Jan. 30, 2020

(51) Int. Cl.
| H01R 12/58 | (2011.01) |
| H01F 27/29 | (2006.01) |
| H01F 27/28 | (2006.01) |
| H01F 27/24 | (2006.01) |
| H01G 4/224 | (2006.01) |
| H01G 4/228 | (2006.01) |
| H05K 1/18 | (2006.01) |

(52) U.S. Cl.
CPC .......... *H01R 12/585* (2013.01); *H01F 27/24* (2013.01); *H01F 27/2823* (2013.01); *H01F 27/29* (2013.01); *H01G 4/224* (2013.01); *H01G 4/228* (2013.01); *H05K 1/181* (2013.01); *H05K 2201/1003* (2013.01); *H05K 2201/10015* (2013.01)

(58) Field of Classification Search
CPC .............................. H01R 12/585; H01F 27/29
See application file for complete search history.

(56) References Cited

U.S. PATENT DOCUMENTS

| 6,320,489 B1 | 11/2001 | Lu et al. | |
| 7,532,484 B1 * | 5/2009 | Sailor | H05K 3/325 361/773 |
| 2004/0112730 A1 * | 6/2004 | Blossfeld | H01H 1/5805 200/284 |

(Continued)

FOREIGN PATENT DOCUMENTS

| CN | 1592550 A | 3/2005 |
| CN | 2845172 Y | 12/2006 |

(Continued)

OTHER PUBLICATIONS

Chinese Office Action dated Mar. 3, 2021 for corresponding Chinese Patent Application No. 201910681534.

(Continued)

*Primary Examiner* — Elvin G Enad
*Assistant Examiner* — Malcolm Barnes

(57) ABSTRACT

A discrete electrical component is disclosed, including a component member having at least one lead; and a base member on which the component member is supported. The electrical component further includes at least one compliant pin member, each compliant pin member having a first end portion configured for press-fit engagement in a printed circuit board and a second end portion electrically connected to the at least one lead of the component member. The at least one compliant pin at least partly extends through or into the base member.

19 Claims, 8 Drawing Sheets

(56) References Cited

U.S. PATENT DOCUMENTS

| | | | | |
|---|---|---|---|---|
| 2007/0293100 A1* | 12/2007 | Jakob | ............... | H01R 12/585 |
| | | | | 439/816 |
| 2009/0325406 A1* | 12/2009 | Kojima | ............ | H01R 12/585 |
| | | | | 439/82 |
| 2010/0267252 A1* | 10/2010 | Fujimoto | ............ | H01G 9/012 |
| | | | | 439/55 |
| 2012/0115339 A1* | 5/2012 | Schaarschmidt | .... | H01R 43/205 |
| | | | | 439/66 |
| 2014/0213124 A1* | 7/2014 | Wu | ............... | H01R 13/6467 |
| | | | | 439/885 |
| 2016/0197419 A1* | 7/2016 | Uchida | ............ | H01R 43/16 |
| | | | | 439/751 |
| 2018/0288878 A1* | 10/2018 | Brucchi | ............ | H01R 12/585 |
| 2018/0351271 A1* | 12/2018 | Geske | ............ | H01R 12/75 |
| 2020/0274294 A1* | 8/2020 | Lynch | ............ | H01R 13/504 |

FOREIGN PATENT DOCUMENTS

| | | | | |
|---|---|---|---|---|
| CN | 201210466 Y | | 3/2009 | |
| CN | 104904068 A | | 9/2015 | |
| DE | 102009054899 A1 | | 6/2011 | |
| FR | 2961356 A1 | * | 12/2011 | ............ H01R 13/405 |
| WO | WO-2012123534 A1 | * | 9/2012 | ............ H01F 7/06 |

OTHER PUBLICATIONS

French Search Report dated Nov. 25, 2021 for corresponding French Patent Application No. 1908382.

* cited by examiner

COMPLIANT PIN STRUCTURE FOR DISCRETE ELECTRICAL COMPONENTS

FIELD OF INVENTION

The present invention generally relates to a pin structure for an electrical component, and particularly to a pin structure which provides one or more compliant pins for a discrete electrical component.

BACKGROUND

Discrete electrical components typically include pins for connection to other electrical components or devices. Such connections often are made via a printed circuit board (PCB). The pins for discrete passive components, such as capacitors and inductors, are typically of two types: 1) through-hole pins having a length for passing through the entire PCB via a hole therein and subsequent soldering at the opposite surface of the PCB from the PCB surface along which the component is positioned; and 2) surface mount pins in which the pins are shaped to be soldered along the same surface of the PCB on which the discrete component is disposed.

Components having through-hole pins often have internal leads which are welded within the component to the external through-hole pins. The use of electrical components having through-hole pins disadvantageously results in a relatively sizeable amount of space being occupied on both sides of the PCB to secure and provide electrical connections to the component.

Existing discrete capacitors having surface mounted pins typically include a plastic housing or base on which the capacitor canister is attached, with surface mount pins extending from the housing for connection along the PCB surface.

SUMMARY

Example embodiments overcome shortcomings found in existing electrical components. According to an example embodiment, there is provided a discrete electrical component, including a component member having at least one lead; and a base member on which the component member is supported. The electrical component further includes at least one compliant pin member, each compliant pin member having a first end portion configured for press-fit engagement in a printed circuit board and a second end portion electrically connected to the at least one lead of the component member. The at least one compliant pin at least partly extends through or into the base member.

In an embodiment, the at least one lead of the component member and the at least one compliant pin member are integrally formed as a unitary member. In another embodiment, the at least one lead of the component member is welded to the second end portion of the at least one compliant pin member.

In a first aspect, at least one of a central portion and the second end portion of the at least one compliant pin member extends through or into the base member. In another aspect, the base member includes a concave portion which receives at least a portion of the component member therein.

In another aspect, the at least one lead includes a plurality of leads, the at least one compliant pin member includes a plurality of compliant pin members, each lead being connected to a compliant pin member, and the base member includes a first base member part and a second base member part, at least a first compliant pin member of the plurality of compliant pin members extends into or through the first base member part and a second compliant pin member of the plurality of compliant pin members extends into or through the second base member part. In another aspect, the first base member part and the second base member part are spaced apart from and not directly connected to each other.

In an aspect, for each compliant pin member, a longitudinal axis of the first end portion is parallel to a longitudinal axis of the second end portion. In another aspect, for a compliant pin member, a longitudinal axis of the first end portion of each compliant pin member is orthogonal to a longitudinal axis of the second end portion of the compliant pin member.

In an aspect, the component member includes at least one core and at least one coil wound around the at least one core. In another aspect, the discrete electrical component is a capacitor.

In another aspect, the at least one lead includes a plurality of leads, the at least one compliant pin member includes a plurality of compliant pin members, each lead being connected to a compliant pin member, and each of the plurality of compliant pin members extends into or through the base member. The plurality of compliant pin members may include one or more unconnected compliant pin members, each unconnected compliant pin member being electrically isolated from the plurality of leads of the component member and extending into or through the base member.

In an example embodiment, a pin structure is disclosed for a pin-less electrical component member having at least one lead. The pin structure may include a base member on which the component member is to be supported; and at least one compliant pin member, each compliant pin member having a first end portion configured for press-fit engagement in a printed circuit board and a second end portion configured for electrical connection with the at least one lead of the component member. The at least one compliant pin at least partly extends through or into the base member.

In one aspect, at least one of a central portion and the second portion of the at least one compliant pin member extends through or into the base member. In another aspect, the base member includes a concave portion which is sized and shaped to receive at least a portion of the component member therein.

In an aspect, the at least one lead includes a plurality of leads, the at least one compliant pin member includes a plurality of compliant pin members, each compliant pin member configured to be connected to a lead, and the base member includes a first base member part and a second base member part, at least a first compliant pin member of the plurality of compliant pin members extends into or through the first base member part and a second compliant pin member of the plurality of compliant pin members extends into or through the second base member part. The first base member part and the second base member part may be spaced apart from and not directly connected to each other.

In another aspect, the at least one lead includes a plurality of leads, the at least one compliant pin member includes a plurality of compliant pin members, each compliant pin member configured to be connected to a lead, and each of the plurality of compliant pin members extends into or through the base member. The plurality of compliant pin members may include one or more unconnected compliant pin members, each unconnected compliant pin member configured to be electrically isolated from the plurality of leads of the component member and extend into or through the base member.

BRIEF DESCRIPTION OF THE DRAWINGS

Aspects of the invention will be explained in detail below with reference to an exemplary embodiment in conjunction with the drawings, in which.

DETAILED DESCRIPTION

Figure 1:
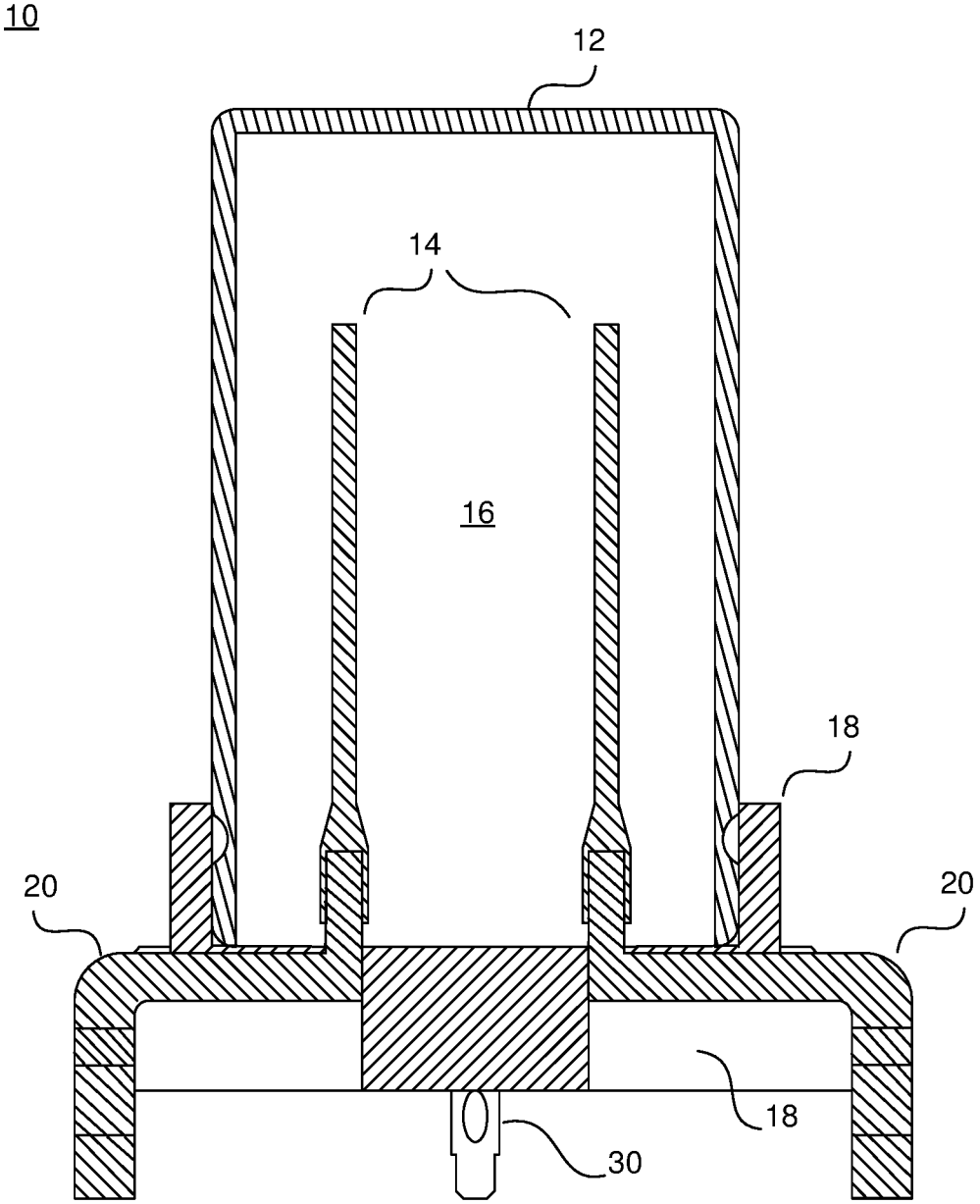
FIG. 1 is a cross-sectional side view of an electrical component according to an example embodiment.
Figure 2:
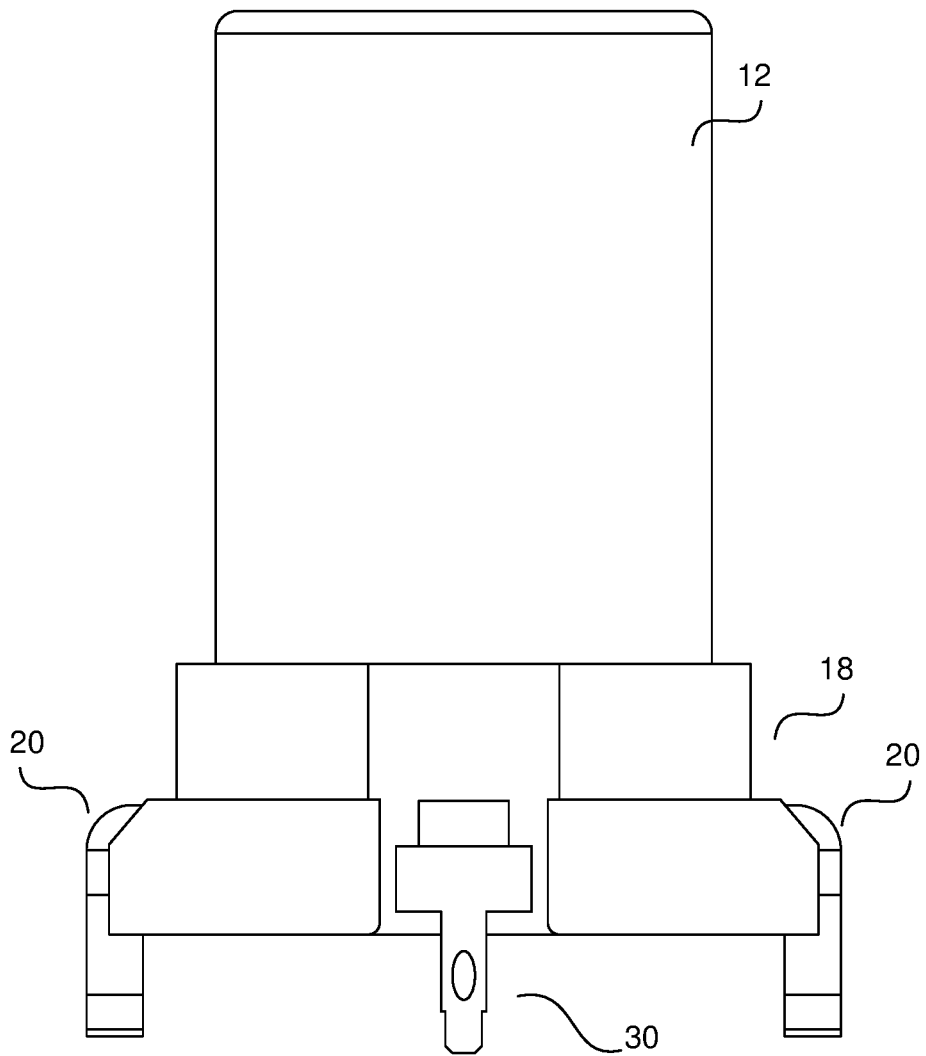
FIG. 2 is a side elevational view of the electrical component of FIG. 1.

The following description of the example embodiments are merely exemplary in nature and are in no way intended to limit the invention, its application, or uses.

The example embodiments are generally directed to discrete electrical components, such as passive electrical components, which are configured with compliant pins for creating a press-fit connection with a PCB or other substrate on which the component is to be attached. The example embodiments described below are directed to discrete passive electrical components.

Referring to FIGS. 1-4, there is shown a discrete electrical component according to an example embodiment. In the embodiment, the electrical component is a capacitor 10 but it is understood that electrical component 10 may be a different discrete electrical component of similar shape and pin count. Capacitor 10 includes a can 12 in which multiples plates or conductive members 14 are disposed. Plates 14 are electrically isolated from each other and separated from each other by a dielectric material 16. Plates 14 may have virtually any shape. Each plate 14 may include or be connected to a lead (not shown) for making an external electrical connection to the plate. In another embodiment, capacitor 10 does not include plates 14 and instead only includes two leads which are disposed in can 12 and separated from each other by dielectric material. Such leads may have any shape. For example, the leads may form an interdigital and/or interstitial pattern with each other. Can 12 may be constructed from a metal composition but it is understood that can 12 may be constructed from other materials. Can 12, plates 14 and the dielectric material together form a component member of capacitor 10.

Capacitor 10 further includes a base member 18 to which can 12 is attached. In the example embodiment illustrated, base member 18 includes a concave portion 18A (FIG. 4) which receives at least a portion of can 12. With can 12 being cylindrically shaped, the concave portion 18A of base member 18 is also cylindrically shaped. Can 12 may be secured to base member 18, such as with an adhesive. Base member 18 has a plastic composition but it is understood that base member 18 may be constructed from other electrically insulating material. Base member 18 provides a stable base on which can 12 is secured. Base member 18 also secures pin members of capacitor 10 thereto, as described below.

Figure 8:
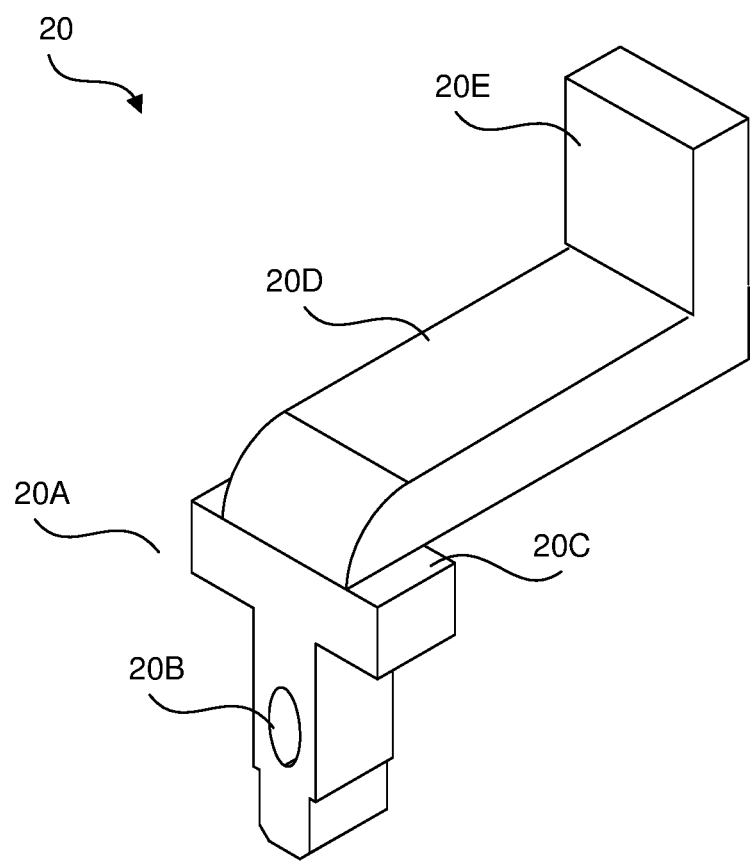
FIG. 8 is a perspective view of a compliant pin of the electrical component of FIG. 1.

Capacitor 10 further includes a plurality of pin members 20, which provide electrical connectivity and mechanical stability to capacitor 10. In the illustrated embodiment, each pin member 20 is a compliant pin for providing a press-fit mechanical engagement with a PCB or other substrate to which capacitor 10 is to be secured. Referring to FIG. 8, each pin member 20 may include a first portion 20A, at least a part of which is insertible into the hole of a PCB or other substrate. First portion 20A is elongated, having a girth that exceeds the diameter of the PCB hole. First portion 20A may also include a through-hole 20B defined laterally through the first portion, with the through-hole 20B being sized to allow first portion 20A to be compressed in a lateral direction. Such compression occurs during insertion of first portion 20A into a PCB hole, and allows for pin member 20 to be secured to the PCB via a press-fit engagement. First portion 20A further includes a shoulder 20C which serves as a stop during insertion of pin member 20 into a PCB hole. Shoulder 20C extends laterally outwardly beyond the diameter of the PCB hole. An upper surface(s) of shoulder 20C may be used to insert pin member 20 into the PCB hole.

Pin member 20 further includes a second portion 20D which extends from first portion 20A. In the example embodiment illustrated in FIGS. 2-4 and 8, a longitudinal axis of second portion 20D is orthogonal to the longitudinal axis of first portion 20A.

Pin member 20 further includes a third portion 20E which extends from second portion 20D. In this way, first portion 20A and third portion 20E may be viewed as first and second end portions, respectively, of pin member 20, with second portion 20D viewed as a central portion. In the illustrated embodiment, a longitudinal axis of third portion 20E is orthogonal to the longitudinal axis of second portion 20D. This may result in the longitudinal axis of first portion 20A being parallel to the longitudinal axis of third portion 20E.

Figure 3:
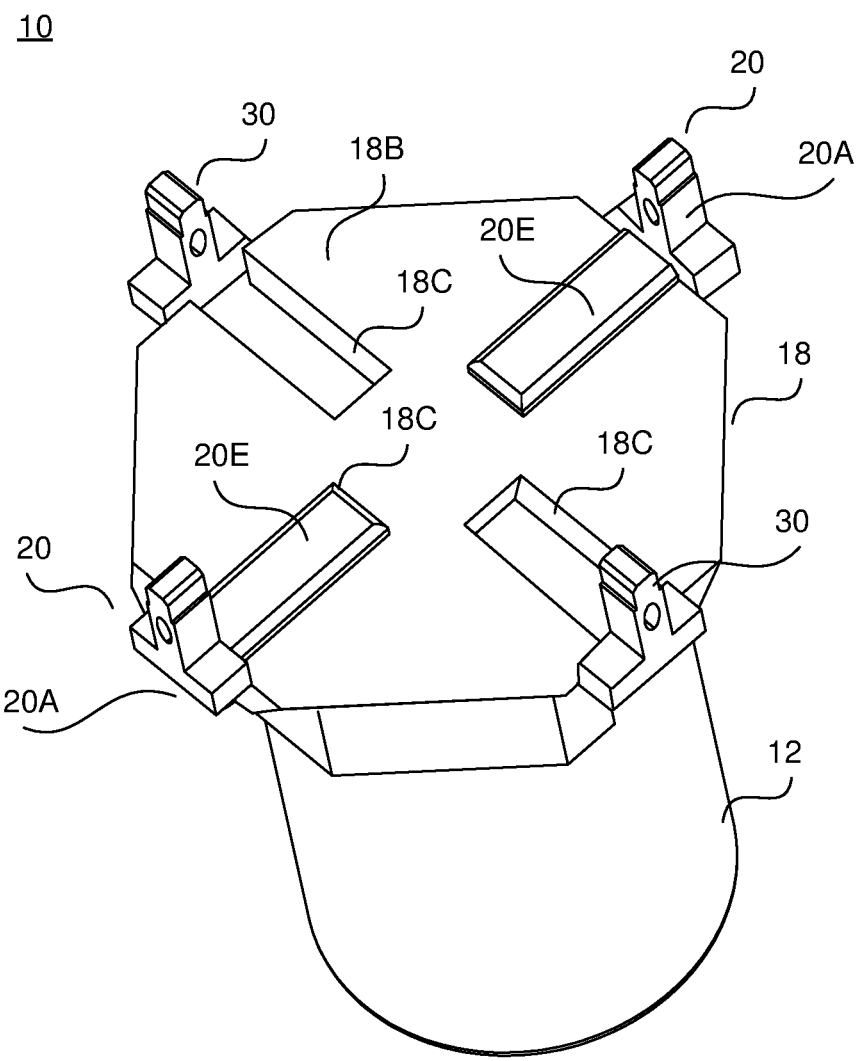
FIG. 3 is a bottom perspective view of the electrical component of FIG. 1.
Figure 4:
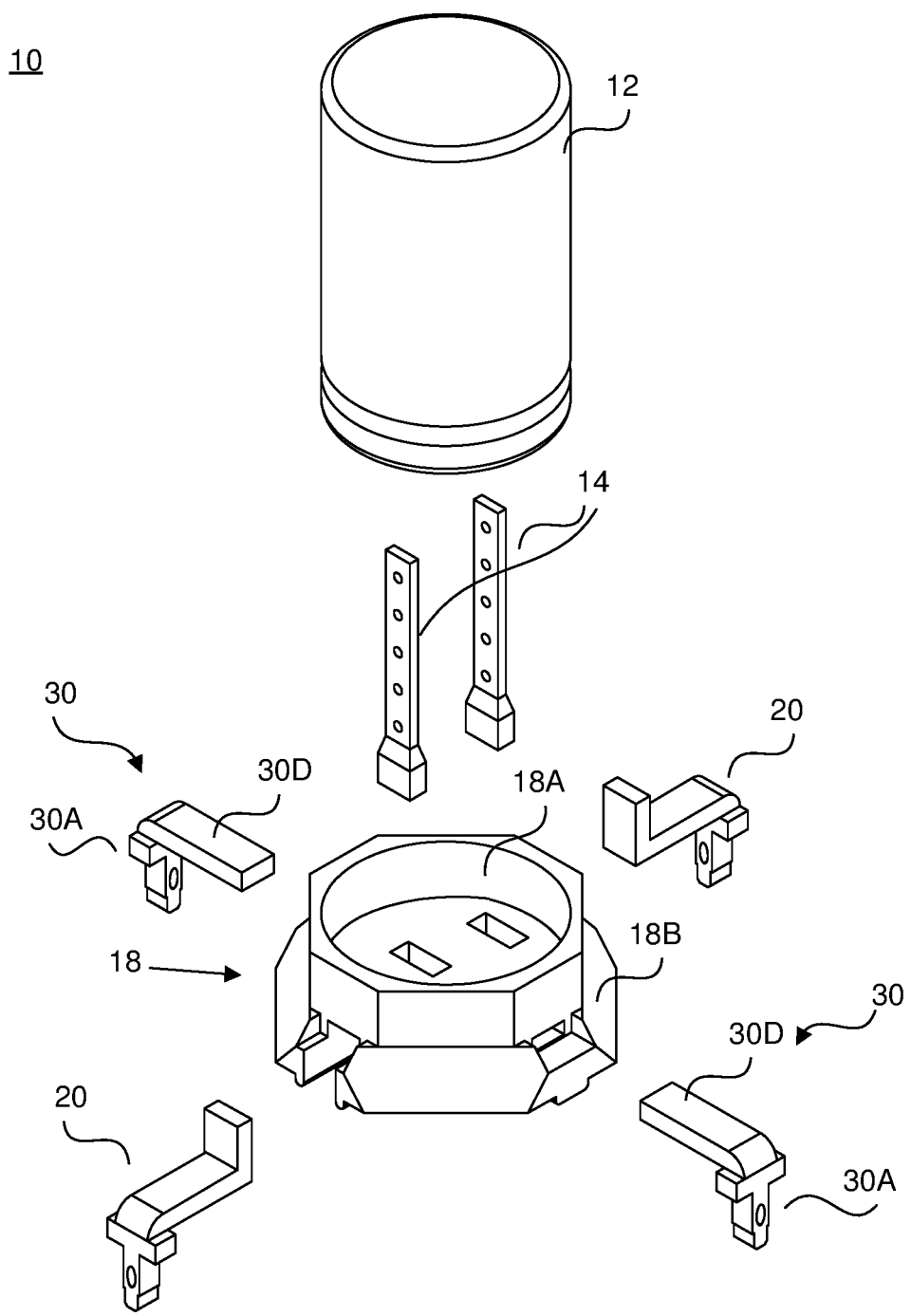
FIG. 4 is an exploded perspective view of the electrical component of FIG. 1.

Referring to FIG. 3, base member 18 includes a largely flat bottom portion 18B which is disposed beneath concave portion 18A. Bottom portion 18B includes one or more grooves or cutouts 18C which allow pin members 20 to extend through bottom portion 18B. Groove 18C extending in this way allows the third portion 20E of a corresponding pin member 20 to be electrically connected to a plate 14 and/or the corresponding lead, and the first portion 20A of such corresponding pin member 20 to sufficiently extend from bottom portion 18B for press-fit insertion in a PCB hole. Each groove 18C extends from the bottom surface of bottom portion 18B to the concave portion 18A of base member 18. Each groove 18C is sized and shaped for accommodating a pin member 20 therein. In one example embodiment, each groove 18C is sized and shaped so that only third portion 20E of a corresponding pin member 20 is disposed within concave portion 18A of base member 18, leaving second portion 20D within groove 18C and first portion 20A of pin member 20 extending outwardly (downwardly) therefrom. In another embodiment, both second portion 20D and third portion 20E are disposed within concave portion 18A. Pin member(s) 20 may be fixedly secured within corresponding groove 18C and/or bottom portion 18B of base member 18, such as with an adhesive or the like.

Capacitor 10 further includes one or more unconnected pin members 30. Each pin member 30 may include a first portion 30A and second portion 30D, similar to first portion 20A and second portion 20D as described above with respect to pin member 20 of FIG. 8. However, each pin member 30 does not extend into concave portion 18 of base member 18 and does not make an electrical connection with any part of capacitor 10. Each pin member 30 may be partly disposed within a groove 18C and fixed therein by an adhesive or other means. Though pin member(s) 30 do not provide electrical connectivity to a plate 14 or any lead within capacitor 10, pin member 30 provides added structural stability for capacitor 10 when press fit within a corresponding PCB hole.

Figure 5:
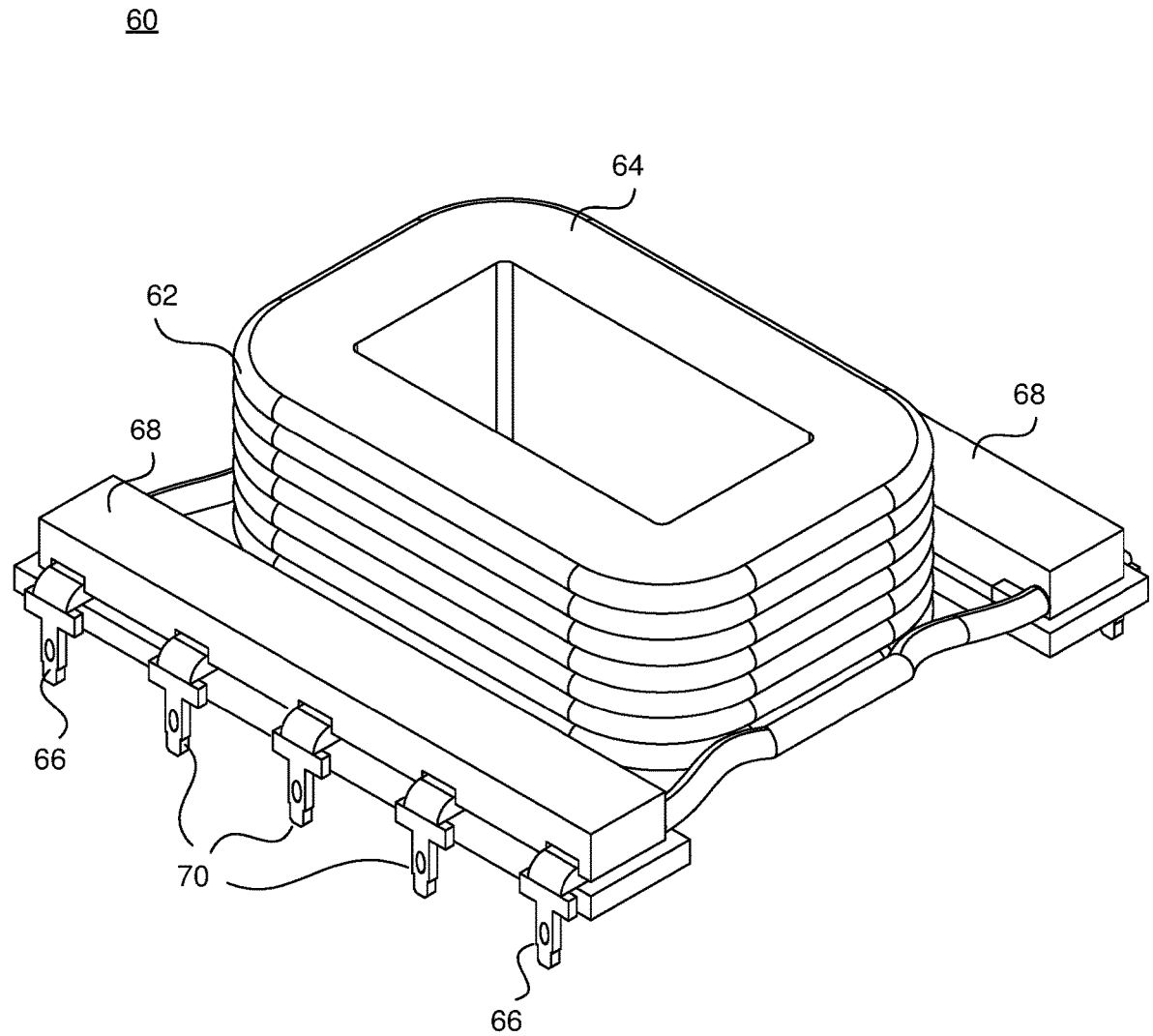
FIG. 5 is a perspective view of an electrical component according to another example embodiment.
Figure 6:
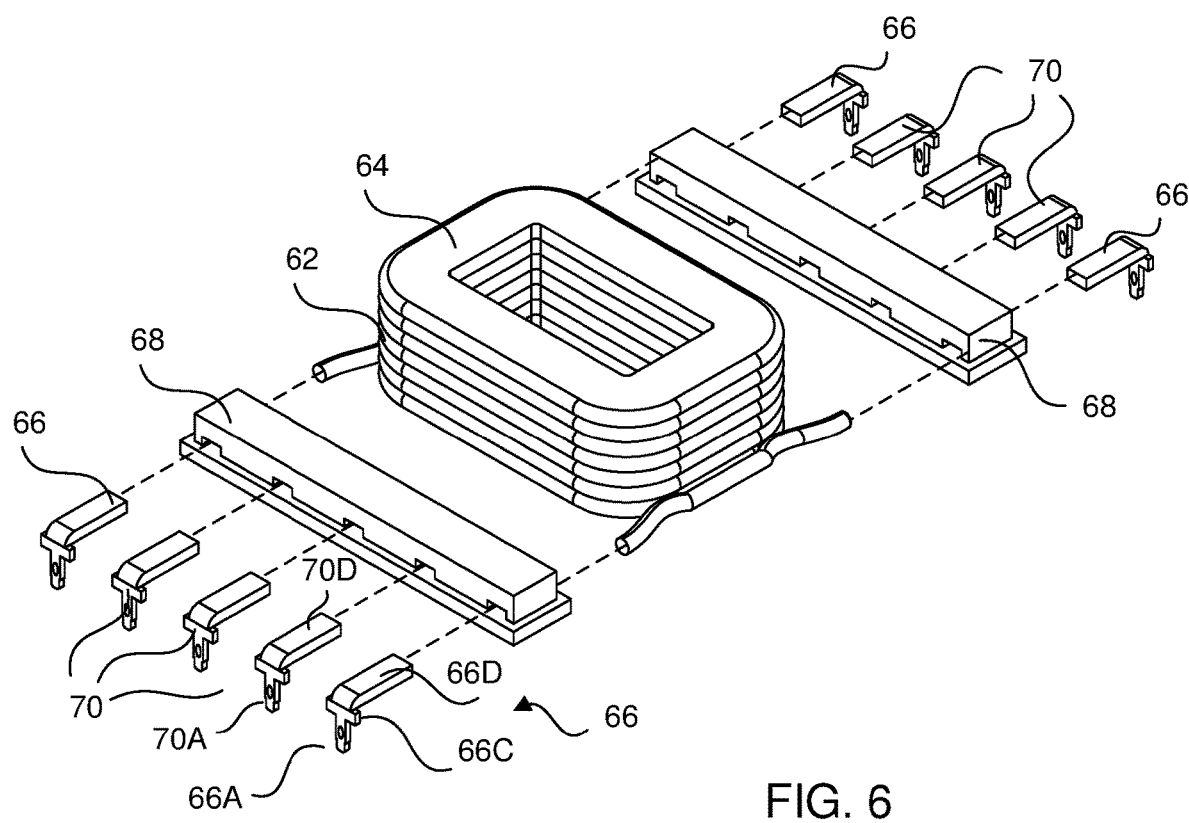
FIG. 6 is an exploded perspective view of the electrical component of FIG. 5.

FIGS. 5 and 6 illustrate an electrical component according to another example embodiment. In this embodiment, the illustrated electrical component is an inductor 60. Inductor 60 includes at least one coil 62. Each coil 62 is constructed from a metal wire that is wound around a hollowed core 64, which may be constructed from a ferromagnetic material, such as iron, or a ferrimagnetic compound such as a ferrite. In the illustrated embodiment, two coils 62 are wound around core 64. In another example embodiment, a single coil 62 is wound around core 64. The ends of each coil 62 form the leads of coil 62 for connection to pin members, as described below. Coil(s) 62 and core 64 together form the component member of inductor 60.

Inductor 60 further includes one or more pin members 66, which provide electrical connectivity and mechanical stability to inductor 60 when inductor 60 is secured to a PCB. In the illustrated embodiment, each pin member 66 is a compliant pin for providing a press-fit mechanical engagement with a PCB or other substrate to which inductor 60 is to be secured. Referring to FIG. 6, each pin member 66 may include a first portion 66A, a part of which is insertible into the hole of a PCB or other substrate. First portion 66A is elongated, having a girth that exceeds the diameter of the PCB hole. First portion 66A may also include a through-hole defined laterally through the first portion, with the through-hole being sized to allow first portion 66A to be compressed in a lateral direction. Such compression occurs during insertion of first portion 66A into a PCB hole, and allows for pin member 66 to be secured to the PCB via a press-fit engagement. First portion 66A further includes a shoulder 66C which serves as a stop during insertion of pin member 66 into a PCB hole. Shoulder 66C extends laterally outwardly beyond the diameter of the PCB hole. An upper surface(s) of shoulder 66C may be used to insert pin member 66 into the PCB hole.

Pin member 66 further includes a second portion 66D which extends from first portion 66A. In the example embodiment illustrated in FIGS. 5 and 6, a longitudinal axis of second portion 66D is orthogonal to the longitudinal axis of first portion 66A. A distal end of second portion 6D may be hollow or included a hollowed portion for receiving an end or lead of a coil 62 therein. Unlike pin member 20, pin member 66 does not include a third portion, such that first portion 66A and second portion 66D form first and second end portions, respectively, of pin member 66.

Inductor 60 may further include one or more unconnected pin members 70. Referring to FIG. 6, each pin member 70 may include a first portion 70A and second portion 70D, similar to first portion 20A and second portion 20D as described above with respect to pin member 20 of FIG. 8. However, each pin member 70 does not make an electrical connection with any part of inductor 60, such as with a coil 62. Though pin member(s) 70 do not provide electrical connectivity to a coil 62 or any lead within inductor 60, pin member 70 provides added structural stability for inductor 60 when press fit within a corresponding PCB hole.

With continued reference to FIGS. 5 and 6, inductor 60 further includes a base member which supports coils 62, core 64 and pin members 66. In the illustrated embodiment, the base member includes a pair of base member parts 68. Each base member part 68 has a plastic composition but it is understood that base member part 68 may be constructed from other electrically insulating material. Base member parts 68 provide a stable base on which coil 62 and pipe 65 are secured. Base member parts 68 are illustrated as being distinct members that are not directly mechanically connected to each other, but it is understood that base member parts 68 may be directly connected to each other, such as with at least one cross-beam member (not shown) which extends in a lateral direction between the base member parts, relative to the longitudinal direction thereof. In this way, such cross-beam member and base member parts 68 may be integrally formed as a unitary member, such as being a single plastic-molded part.

Each base member part 68 is sized to receive one or more pin members 66, 70. Specifically, the second portion 66D and 70D of each pin member 66 and 70, respectively, extends at least partly through the corresponding base member part 68 at a location thereon such that first portion 66A and 70A of pin members 66 and 70, respectively, extend sufficiently downwardly from base member part 68 for secure insertion within the holes of a PCB. As illustrated in FIG. 6, the second portion of each pin member 66, 70 extends in a lateral direction through base member part 68 along a top portion of a longitudinal side thereof, but it is understood that the second portion may extend along other portions of base member part 68 and in other directions.

In the example embodiment illustrated in FIG. 5, the distal end of second portion 66D and 70D of pin members 66 and 70, respectively, at least partly extends from their corresponding base member part 68. The distal end of each second portion 66D of pin members 66 is electrically and mechanically connected to an end or lead of a coil 62. Such connection may be a weld connection or the like. Pin member 66 and a corresponding coil 62 may be integrally formed as a unitary member. In an example embodiment, the end or lead of a coil 62 may be inserted within the second portion 66D of pin member 66 and welded or otherwise secured thereto. In the an embodiment, the distal end of second portion 70D of each unconnected pin members 70 extends from corresponding base member part 68. In another embodiment, the distal end of second portion 70D does not extend from base member part 68.

Figure 7:
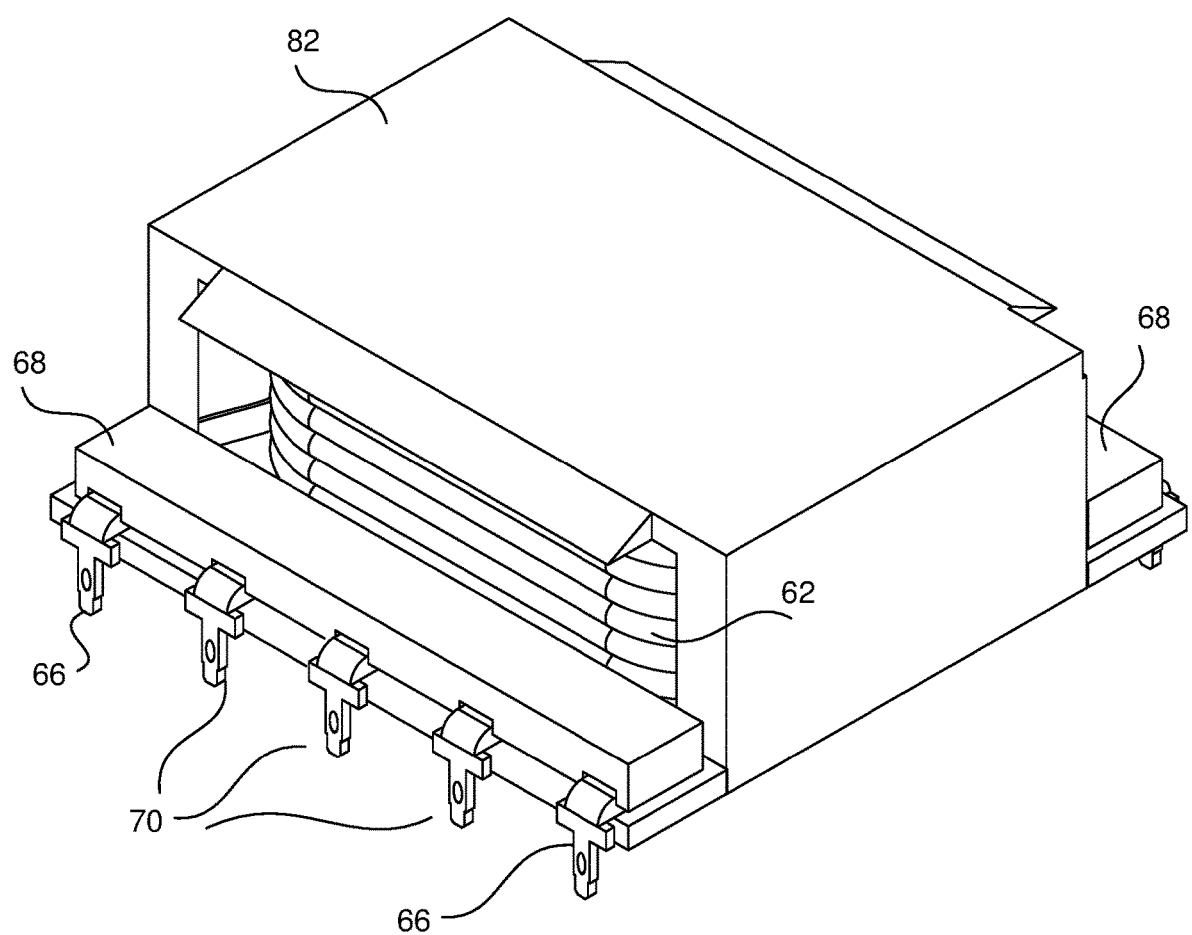
FIG. 7 is a perspective view of an electrical component according to another example embodiment.

FIG. 7 illustrates an electrical component according to another example embodiment. The electrical component is an inductor 80 having the same components of inductor 60 described above, including coils 62, pin members 60 and 70, and base member parts 68. In addition, instead of core 64, inductor 80 includes a core 82 having a different shape. In the embodiment illustrated, core 82 may have an E-shape or the shape of a "block 8," similar to the shape of a cinder block, with coil 62 wrapped around the center tine of the core. In the case of the block 8 shape, core 82 may be formed from plural core members which are combined, connected or otherwise mechanically held together.

In another example embodiment, base member 18 and pin members 20, 30 of capacitor 10 may form a pin structure which may be used with any pin-less component member for creating a discrete electrical component. Similarly, base member parts 68 and pin members 66, 70 of inductors 60, 80, may form a pin structure which may be used with any pin-less component member for creating a discrete electrical component. In this way, such pin structures may be manufactured and sold separately from the component members which may attach thereto.

The example embodiments have been described herein in an illustrative manner, and it is to be understood that the terminology which has been used is intended to be in the nature of words of description rather than of limitation. Obviously, many modifications and variations of the invention are possible in light of the above teachings. The description above is merely exemplary in nature and, thus, variations may be made thereto without departing from the spirit and scope of the invention as defined in the appended claims.

What is claimed is:

1. A discrete electrical component, comprising:
    a component member having a can and at least one plate, the at least one plate disposed within the can;
    a base member on which the component member is supported; and
    at least one compliant pin member, each compliant pin member having a first end portion configured for press-fit engagement in a printed circuit board and a second end portion electrically connected to the at least one plate of the component member, the at least one compliant pin member at least partly extending through or into the base member, wherein the first end portion extends outwardly from an outer vertical periphery of the base member, wherein the at least one plate of the component member is welded to the second end portion of the first compliant pin member within the can.

2. The discrete electrical component of claim 1, wherein the at least one lead of the component member and the at least one compliant pin member are integrally formed as a unitary member.

3. The discrete electrical component of claim 1, wherein at least one of a central portion and the second end portion of the at least one compliant pin member extends through or into the base member.

4. The discrete electrical component of claim 1, wherein the base member includes a concave portion which receives at least a portion of the component member therein.

5. The discrete electrical component of claim 1, wherein the at least one plate comprises a plurality of leads, the at least one compliant pin member comprises a plurality of compliant pin members, each lead being connected to a compliant pin member, and the base member includes a first base member part and a second base member part, at least a first compliant pin member of the plurality of compliant pin members extends into or through the first base member part and a second compliant pin member of the plurality of compliant pin members extends into or through the second base member part.

6. The discrete electrical component of claim 5, wherein the first base member part and the second base member part are spaced apart from and not directly connected to each other.

7. The discrete electrical component of claim 1, wherein for each compliant pin member, a longitudinal axis of the first end portion is parallel to a longitudinal axis of the second end portion.

8. The discrete electrical component of claim 1, wherein for each compliant pin member, a longitudinal axis of the first end portion is orthogonal to a longitudinal axis of the second end portion of the compliant pin member.

9. The discrete electrical component of claim 1, wherein the component member comprises at least one core and at least one coil wound around the at least one core.

10. The discrete electrical component of claim 1, wherein the discrete electrical component comprises a capacitor.

11. The discrete electrical component of claim 1, wherein the at least one plate comprises a plurality of leads, the at least one compliant pin member comprises a plurality of compliant pin members, each lead being connected to a compliant pin member, and each of the plurality of compliant pin members extends into or through the base member.

12. The discrete electrical component of claim 11, further comprising at least one unconnected compliant pin members, each unconnected compliant pin member being electrically isolated from the plurality of leads of the component member and extending into or through the base member.

13. A pin structure for a pin-less electrical component member having a can and at least one plate, the at least one plate disposed within the can, the pin structure comprising:
    a base member on which the component member is to be supported; and
    at least one compliant pin member, each compliant pin member having a first end portion configured for press-fit engagement in a printed circuit board and a second end portion configured for electrical connection with the at least one plate of the component member, the at least one compliant pin member at least partly extending through or into the base member, wherein the first end portion extends outwardly from an outer vertical periphery of the base member, wherein the at least one plate of the component member is welded to the second end portion of the first compliant pin member within the can.

14. The pin structure of claim 13, wherein at least one of a central portion and the second end portion of the at least one compliant pin member extends through or into the base member.

15. The pin structure of claim 13, wherein the base member includes a concave portion which is sized and shaped to receive at least a portion of the component member therein.

16. The pin structure of claim 13, wherein the at least one plate comprises a plurality of leads, the at least one compliant pin member comprises a plurality of compliant pin members, each compliant pin member configured to be connected to a lead, and the base member includes a first base member part and a second base member part, at least a first compliant pin member of the plurality of compliant pin members extends into or through the first base member part and a second compliant pin member of the plurality of compliant pin members extends into or through the second base member part.

17. The pin structure of claim 16, wherein the first base member part and the second base member part are spaced apart from and not directly connected to each other.

18. The pin structure of claim 13, wherein the at least one plate comprises a plurality of leads, the at least one compliant pin member comprises a plurality of compliant pin members, each compliant pin member configured to be connected to a lead, and each of the plurality of compliant pin members extends into or through the base member.

19. The pin structure of claim 18, further comprising one or more unconnected compliant pin members, each unconnected compliant pin member extending into or through the base member and configured not to be connected to the pin-less electrical component.

* * * * *